US009443696B2

United States Patent
Jiang et al.

(10) Patent No.: US 9,443,696 B2
(45) Date of Patent: Sep. 13, 2016

(54) ELECTRON BEAM IMAGING WITH DUAL WIEN-FILTER MONOCHROMATOR

(71) Applicant: KLA-Tencor Corporation, Milpitas, CA (US)

(72) Inventors: Xinrong Jiang, Palo Alto, CA (US); Liqun Han, Pleasanton, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 14/711,607

(22) Filed: May 13, 2015

(65) Prior Publication Data

US 2015/0340200 A1    Nov. 26, 2015

Related U.S. Application Data

(60) Provisional application No. 62/002,894, filed on May 25, 2014.

(51) Int. Cl.
| | |
|---|---|
| *H01J 37/26* | (2006.01) |
| *H01J 37/05* | (2006.01) |
| *H01J 37/06* | (2006.01) |
| *H01J 37/10* | (2006.01) |
| *H01J 37/28* | (2006.01) |

(52) U.S. Cl.
CPC ............. *H01J 37/26* (2013.01); *H01J 37/05* (2013.01); *H01J 37/06* (2013.01); *H01J 37/10* (2013.01); *H01J 37/28* (2013.01); *H01J 2237/057* (2013.01)

(58) Field of Classification Search
CPC .......... H01J 37/26; H01J 37/05; H01J 37/06; H01J 2237/057
See application file for complete search history.

(56) References Cited

U.S. PATENT DOCUMENTS

| | | | |
|---|---|---|---|
| 6,407,384 B1 * | 6/2002 | Tanaka | H01J 37/05 |
| | | | 250/305 |
| 6,960,763 B2 | 11/2005 | Lopez et al. | |
| 7,838,827 B2 | 11/2010 | Ose et al. | |
| 8,183,526 B1 | 5/2012 | Mankos | |
| 8,274,046 B1 | 9/2012 | Ren et al. | |
| 8,461,525 B2 | 6/2013 | Henstra | |
| 8,592,761 B2 | 11/2013 | Ren et al. | |
| 8,710,452 B2 | 4/2014 | Henstra | |
| 2007/0069150 A1 | 3/2007 | Frosein et al. | |
| 2012/0318978 A1 | 12/2012 | Ren et al. | |
| 2013/0256530 A1 | 10/2013 | Jiang et al. | |

FOREIGN PATENT DOCUMENTS

| | | |
|---|---|---|
| EP | 1220292 B1 | 11/2001 |
| JP | 2000100361 A | 4/2000 |
| JP | 2000228162 A | 8/2000 |

OTHER PUBLICATIONS

W. H. J. Andersen et al., "A double wienfilter as a high resolution, high transmission electron energy analyzer", Journal of Physics E: Scientific Instruments, 1970, vol. 3, pp. 121-126.*
PCT International Search Report for Application No. PCT/US2015/032173, Aug. 28, 2015, 3 sheets.
W. Kaiser, et al "The 4-Wienfilter-Monochromator integrated in a conventional SEM", MC 2009, pp. 57-58, Institute of Applied Physics, http://www.univie.ac.at/asem/Graz_MC_09/papers/21428.pdf.
H. Rose, et al "Aberration Correction in Electron Microscopy", pp. 44-48, Proceedings of 2005 Particle Accelerator Conference, http://www.ipd.anl.gov/anlpubs/2001/08/40555.pdf.

* cited by examiner

*Primary Examiner* — Jack Berman
(74) *Attorney, Agent, or Firm* — Okamoto & Benedicto LLP

(57) ABSTRACT

One embodiment relates to a dual Wien-filter monochromator. A first Wien filter focuses an electron beam in a first plane while leaving the electron beam to be parallel in a second plane. A slit opening allows electrons of the electron beam having an energy within an energy range to pass through while blocking electrons of the electron beam having an energy outside the energy range. A second Wien filter focuses the electron beam to become parallel in the first plane while leaving the electron beam to be parallel in the second plane. Other embodiments, aspects and features are also disclosed.

22 Claims, 7 Drawing Sheets

FIG. 5      500

ELECTRON BEAM IMAGING WITH DUAL WIEN-FILTER MONOCHROMATOR

CROSS-REFERENCE TO RELATED APPLICATION(S)

The present patent application claims the benefit of U.S. Provisional Patent Application No. 62/002,894, filed May 25, 2014, the disclosure of which is hereby incorporated by reference.

BACKGROUND OF THE INVENTION

1. Field of the Invention

The present invention relates to apparatus and methods for electron beam imaging.

2. Description of the Background Art

Electron beam imaging systems typically use an electron beam column to scan an electron beam across a region of a substrate surface to obtain image data. The present disclosure provides novel and inventive apparatus and methods for super-high resolution electron beam imaging.

SUMMARY

One embodiment relates to an electron beam imaging apparatus that includes first and second Wien filters and a slit aperture therebetween. An emitter-source tip emits electrons, and a gun electron lens focuses the electrons to form an electron beam that is parallel. The first Wien filter focuses the electron beam in a first plane while leaving the electron beam to be parallel in a second plane. The slit opening of a slit aperture is used to filter out electrons with energies outside an energy range. The second Wien filter focuses the electron beam to become parallel in the first plane while leaving the electron beam to be parallel in the second plane.

Another embodiment relates to a method of electron beam imaging. Electrons are emitted from an emitter source. The electrons are focused by a gun lens to form an electron beam that is parallel in that the electron beam has electron trajectories that are parallel. The electron beam is focused by a first one-dimensional Wien filter to a first crossover in a first plane while leaving the electron beam to be parallel in a second plane, wherein the first crossover coincides with a slit opening. The electrons of the electron beam with energies within an energy range are passed through the slit opening, while electrons of the electron beam with energies outside the energy range are blocked. The electron beam is focused by a second one-dimensional Wien filter to become parallel in the first plane while leaving the electron beam to be parallel in the second plane.

Another embodiment relates to a dual Wien-filter monochromator. A first Wien filter focuses an electron beam in a first plane while leaving the electron beam to be parallel in a second plane. A slit opening allows electrons of the electron beam having an energy within an energy range to pass through while blocking electrons of the electron beam having an energy outside the energy range. A second Wien filter focuses the electron beam to become parallel in the first plane while leaving the electron beam to be parallel in the second plane.

Other embodiments, aspects and features are also disclosed.

DETAILED DESCRIPTION

The source energy spread in an electron beam emitter is a difficult obstacle to significant improvement in the performance of state-of-the-art electron beam imaging systems, such as scanning electron microscope (SEM) and review systems. Not only does the source energy spread dominantly influence the resolution, but it also degrades the image uniformity across a field of view (FOV), limits the electron beam tilt-angle to collect the wall information from a wall feature on a target surface, and further degrades resolution due to an energy-dispersion effect in the Wien filter that separates the secondary electrons from the primary electrons of the incident beam.

The present disclosure provides apparatus and methods to overcome the difficult obstacle discussed above. The present disclosure provides a dual Wien-filter monochromator. The dual Wien-filter monochromator includes first and second one-dimensional Wien filters and a slit aperture positioned therebetween.

Figure 1:
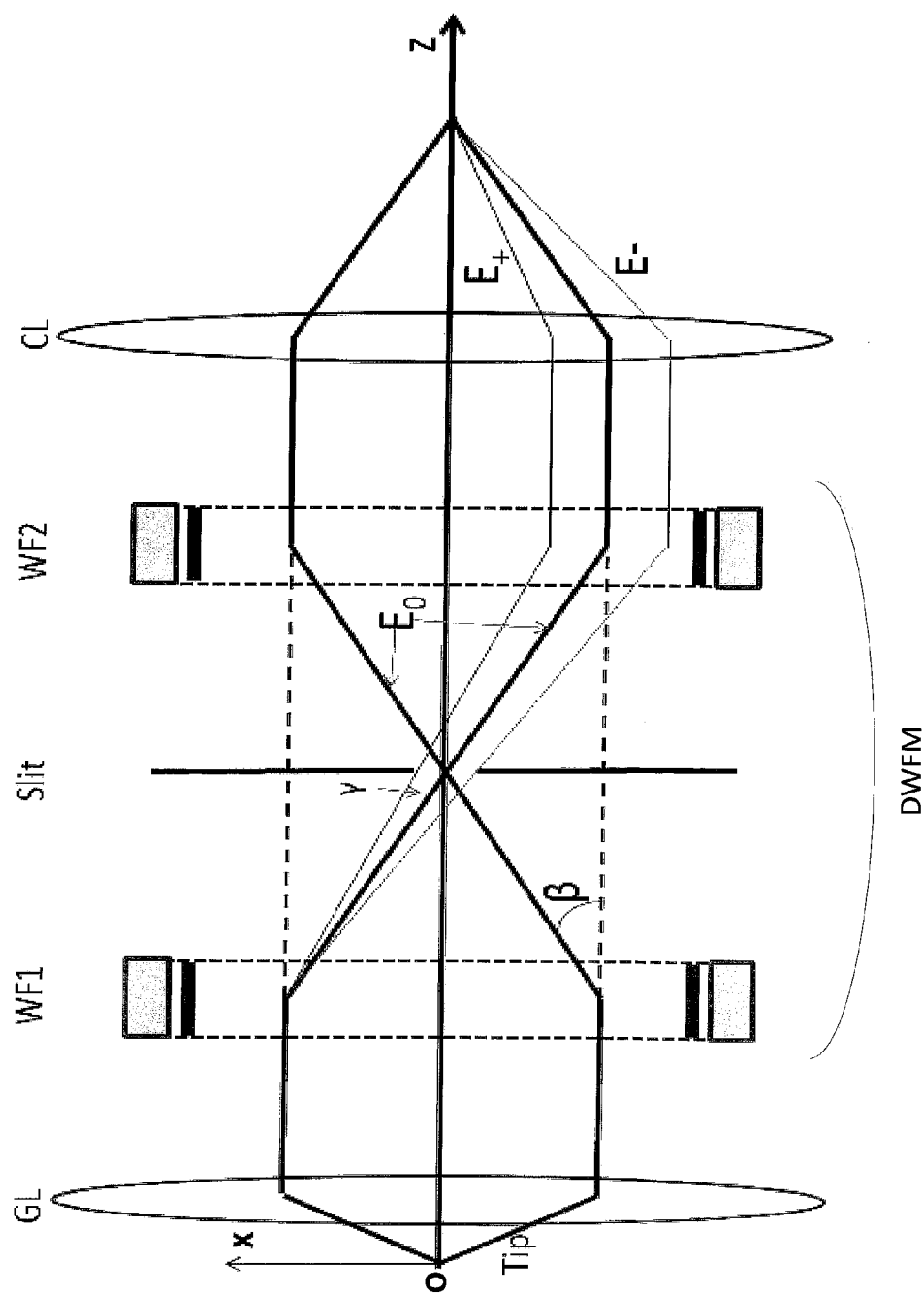
FIG. 1 is an electron ray diagram of a dual Wien-filter monochromator for use in an electron beam column in an accordance with an embodiment of the invention.

FIG. 1 is an electron ray diagram of a dual Wien-filter monochromator (DWFM) for use in an electron beam column in an accordance with an embodiment of the invention. As depicted, the dual Wien-filter monochromator includes two one-dimensional (1D) Wien filters (WF1 and WF2) with a slit (Slit) positioned in between them.

As depicted, the z-axis is the optical axis of the electron beam column. The electrons are emitted from an emitter tip (Tip) that may be defined to be at an origin of the coordinate system, and the emitted electrons are focused to a parallel electron beam by a gun lens (GL). The parallel electron beam is the incident electron beam that enters the monochromator.

The incident electron beam is received by the first 1D Wien filter (WF1). The first 1D Wien filter is one-dimensional in that it provides energy-filtering using one dimension but not the other dimension (in this case, the x-dimension, but not the y-dimension). In the exemplary implementation shown, WF1 generates a magnetic field and/or electric field to focus the electron beam with a focusing angle, $\beta$, in the x-o-z plane (in the plane of the page), but it does not focus the beam in the y-o-z plane (out of the plane of the page). Because the focusing strength of WF1 is zero in the y-o-z plane, the electron beam remains parallel when considering only velocity components in the y-o-z plane.

Because the crossover due to focusing by WF1 is in only one plane, it may be referred to herein as a one-dimensional crossover or a line-segment-shaped crossover. Advantageously, the one-dimensional crossover of the electron beam substantially reduces electron-electron interactions compared to a crossover in both the x-o-z and the y-o-z planes (i.e. a two-dimensional crossover or spot-shaped crossover).

The length of the slit in the y-dimension may be greater than the beam width in that dimension. The width of the slit in the x-dimension may be designed depending on the required energy-filtering resolution, $\Delta E$.

The slit width allows only electrons with an energy near beam energy $E_0$ to pass through. The energy spread of the beam that is allowed to pass through is the energy-filtereing resolution, $\Delta E$. Hence, the energy range of the electrons passing through the slit is from $E-=E_0-\Delta E/2$ to $E+=E_0+\Delta E/2$. As shown, the electrons with energies below $E-$ may be blocked by a bottom portion of the slit, and the electrons with energies above $E+$ may be blocked by a top portion of the slit.

Because the incident electron beam into the monochromator is a parallel beam, WF1 is configured to provide a large focusing angle, $\beta$, of the beam in the x-o-z plane so as to focus the one-dimensional cross-over onto the slit. The focusing strength (and hence the focusing angle) may be controlled by controlling an excitation voltage, $V_{WF1}$, applied to WF1.

Advantageously, given a desired $\Delta E$, a focusing angle, $\beta$, that is large allows for a large width of the slit, which enables the slit to be manufactured with sufficient accuracy without difficulty. In addition, passing the electrons through the wider slit results in reduced electron-electron interactions.

In contrast, in a dual Wien-filter monochromator with a focused (i.e. non-parallel), rather than parallel, incident electron beam, the focusing angle, $\beta$, may be much narrower. Due to the narrower focusing angle, a much smaller width of the slit is required and may be difficult to manufacture accurately. In addition, passing the electrons through the narrower slit results in increased electron-electron interactions.

Like the first 1D Wien filter (WF1), the second 1D Wien filter (WF2) focuses the energy-filtered electron beam in the x-o-z plane, while not affecting the beam in the y-o-z plane. The focusing by WF2 is at a focusing strength such that the energy-filtered electron beam exits WF2 as a parallel electron beam in the x-o-z plane (and also in the y-o-z plane).

In accordance with an embodiment of the invention, WF1 and WF2 may be symmetrical to the slit both mechanically (including distance away from the slit) and electrically. As such, the focusing and deflecting capabilities of WF1 and WF2 are the same.

Subsequently, as shown, a condenser lens (CL) may further focus the energy-filtered electron beam. The beam may then pass through further components of the electron beam column. Such further components are described below in relation to FIG. 4, for example.

Figure 2:
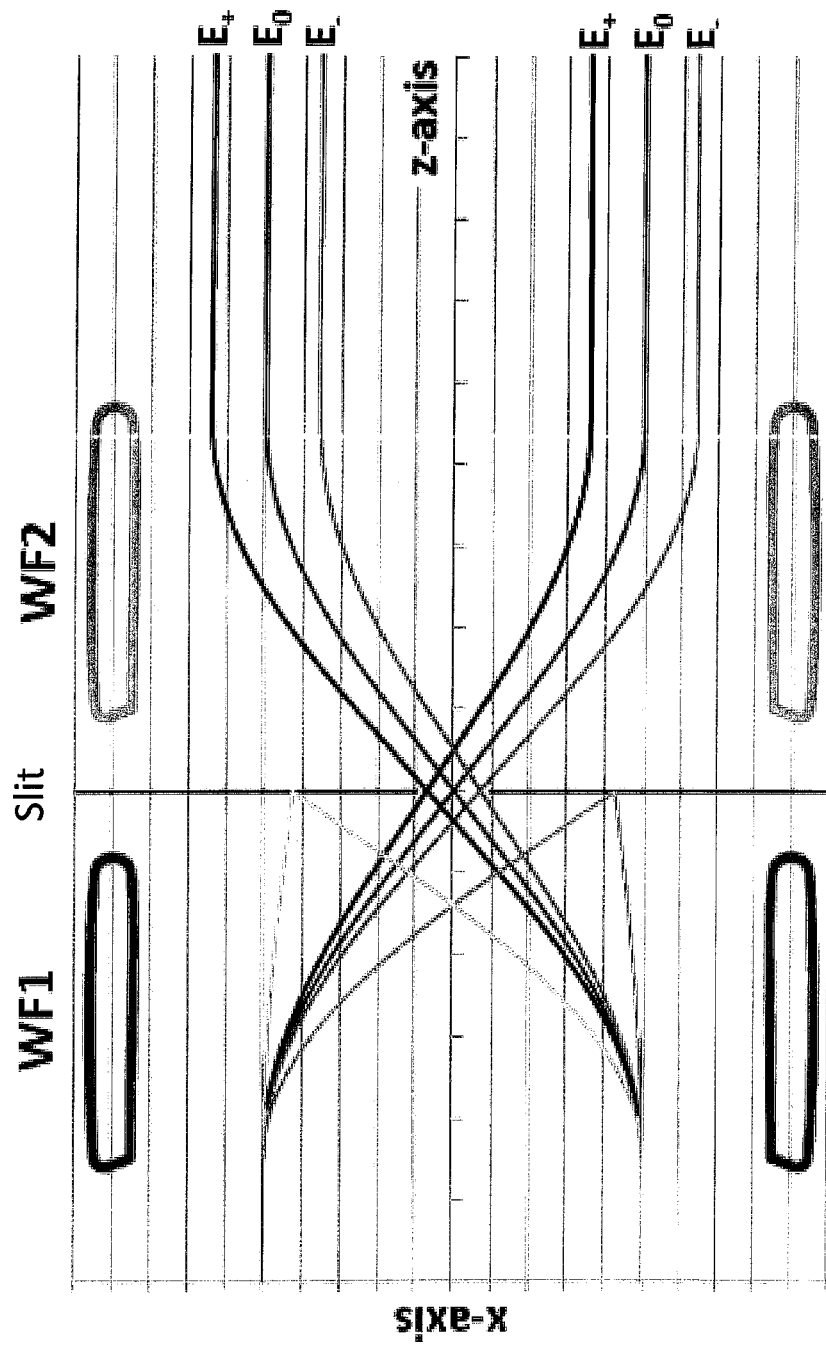
FIG. 2 depicts simulations of a dual Wien-filter monochromator with parallel electron beam illumination in accordance with an embodiment of the invention.

FIG. 2 depicts simulations of a dual Wien-filter monochromator with parallel electron beam illumination in accordance with an embodiment of the invention. The figure shows simulated paths in the x-o-z plane of electrons at energy $E_0$ and at energies above (E+) and below (E−) $E_0$.

As shown, the paths of the incident electrons entering the dual Wien-filter monochromator are parallel. The first 1D Wien filter (WF1) focuses the incident electrons through the slit opening (Slit) such that electrons with energies in the range from E− to E+ pass through the slit opening, but electrons with energies outside that range are blocked by the electron-opaque material around the slit opening. The energy-filtered electrons are then focused by the second 1D Wien filter (WF2) so that the paths of the electrons exiting the dual Wien-filter monochromator are parallel.

Figure 3:
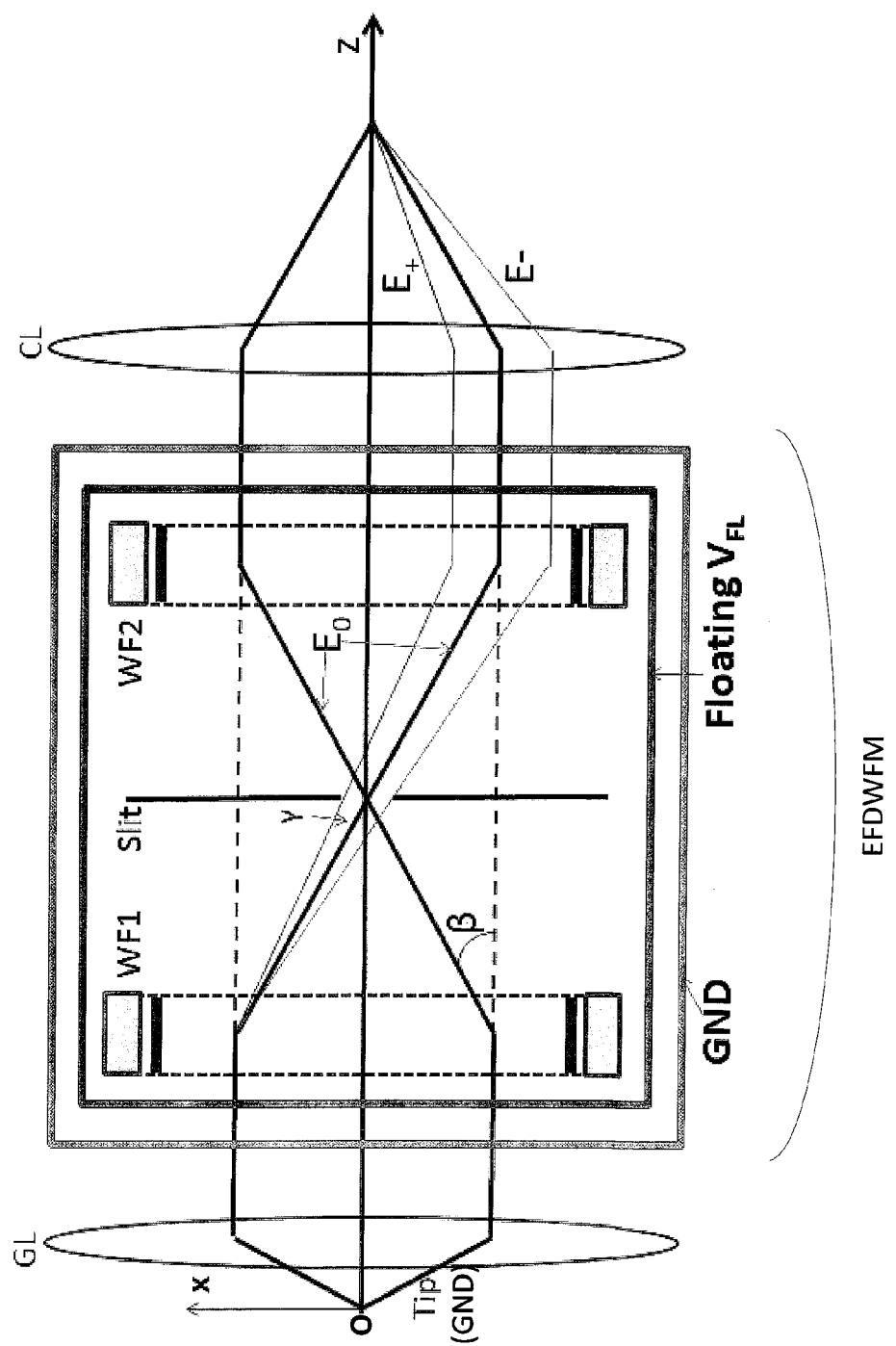
FIG. 3 is an electron ray diagram of an electrically-floated dual Wien-filter monochromator for use in an electron beam column in an accordance with an embodiment of the invention.

FIG. 3 is an electron ray diagram of an electrically-floated dual Wien-filter monochromator (EFDWFM) for use in an electron beam column in an accordance with an embodiment of the invention. The arrangement of the two 1D Wien filters (WF1 and WF2) and the slit opening (Slit) is basically the same in FIG. 3 as the arrangement in FIG. 1. However, in the embodiment of FIG. 3, the components of the dual Wien-filter monochromator module (i.e. WF1, Slit, and WF2) are floated electrically.

In an exemplary implementation shown in FIG. 3, the components of the monochromator module are surrounded by two conductive enclosures or cages (i.e. two Faraday cages), each having openings for the incident and exiting electron beams. The outer of the two conductive enclosures may be electrically grounded so as to be at the same voltage level as the emitter tip (which is also electrically grounded), and the inner of the two conductive enclosures (cages) may have a floating DC voltage ($V_{FL}$) applied to it.

The grounded and floating enclosures (cages) in FIG. 3 causes deceleration of the electrons as they enter through the first 1D Wien filter (WF1) and acceleration of the electrons as they exit via the second 1D Wien filter (WF2). Due to the decelaration and acceleration, the velocities of the electrons are slower within the EFDWFM of FIG. 3 compared with the velocities of the electrons within the DWFM of FIG. 1. In particular, the velocities of the electrons within the EFDWFM of FIG. 3 are proportional to the electron beam potential, $V_a$, which is equal to the floating DC voltage, $V_{FL}$, which is controlled to provide the slower speed of the electrons.

Advantageously, the slower electron speed inside the monochromator enables the use of a slit with a larger width, making it more practical to manufacture the slit and protect the slit from charging or de-shaping. In addition, the larger width slit reduces electron-electron interactions in the monochromator module.

Figure 4:
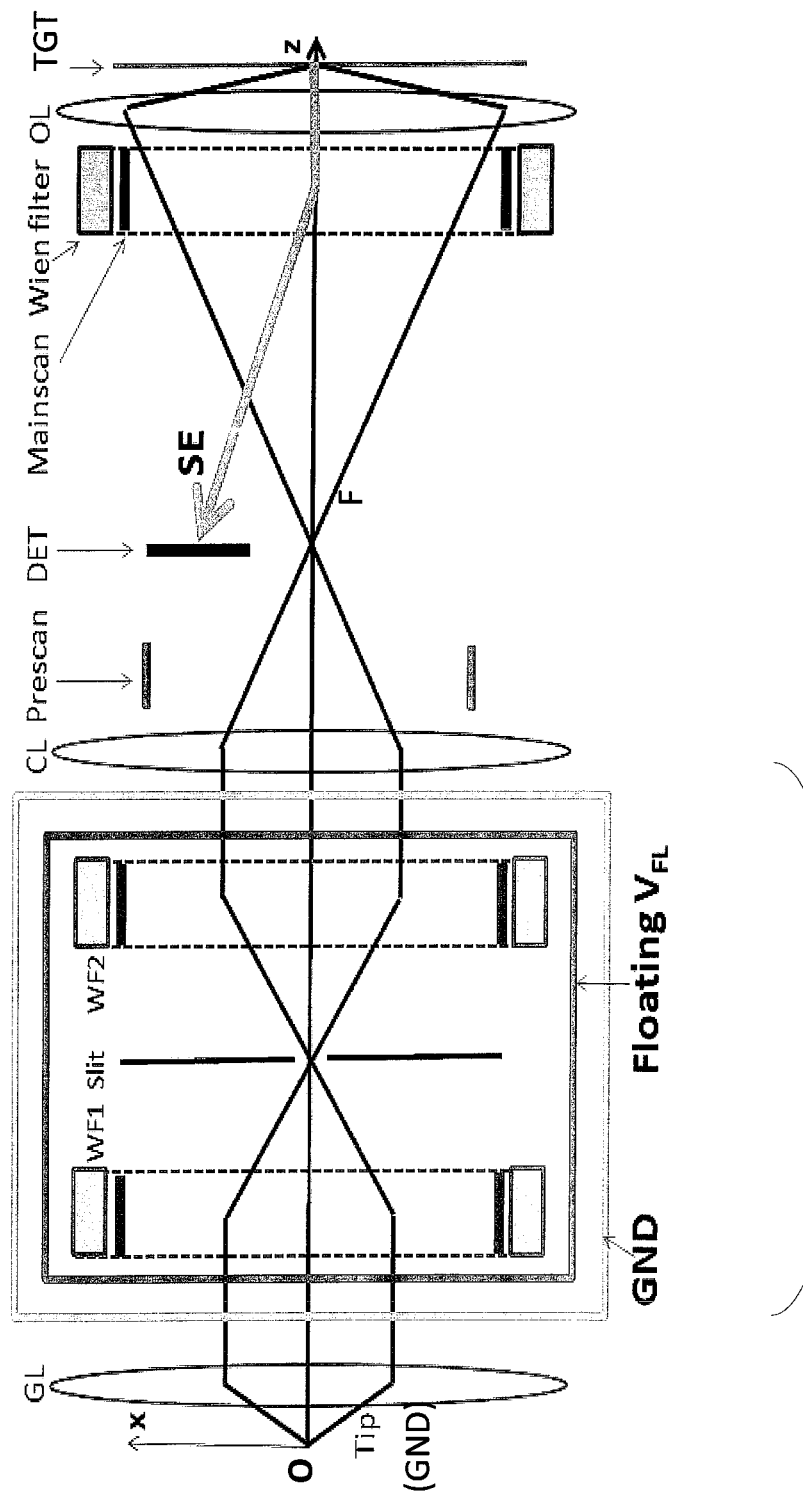
FIG. 4 is an electron ray diagram of an electron beam column incorporating a dual Wien-filter monochromator in an accordance with an embodiment of the invention.

FIG. 4 is an electron ray diagram of an electron beam column incorporating a dual Wien-filter monochromator in an accordance with an embodiment of the invention. The column depicted includes the emitter tip (Tip), gun lens (GL), electrically-floated dual Wien-filter monochromator (EFDWFM), and condenser lens (CL) of FIG. 3. Alternatively, the dual Wien-filter monochromator (DWFM) of FIG. 1 may be included in a column, instead of the electrically-floated dual Wien-filter monochromator of FIG. 3.

As shown in FIG. 4, the condenser lens focuses the beam so as to form a crossover (F) before the beam reaches the objective lens (OL). In this case, the crossover is an image of the emitter tip, rather than an image of the slit aperture. In contrast, in a prior apparatus that uses focusing beam illumination, an image of the aperture, rather than the emitter tip, would be formed, instead.

In the electron beam column depicted in FIG. 4, the gun lens (GL) selects beam currents together with the slit aperture. The condenser lens (CL) selects the optimal numerical aperture (NA) formed by the objective lens (OL). The optimal NA is the NA at which the electron beam spot size at the target substrate (TGT) is minimized by balancing the chromatic aberration and diffraction aberration.

Note that, in general, the various lenses discussed herein as focusing the electron beam are electron lenses. These lenses may be implemented as magnetic and/or electrostatic lenses.

Note that, in the y-o-z plane, the focusing strength of WF1 and WF2 are both zero. As such, the non-impacted parallel beam in the y-o-z plane is focused in the same image-plane as the energy-filtered parallel beam in the x-o-z plane. Hence, the numerical aperture of the objective lens (OL) may be rotationally symmetric.

The features on the target substrate may be examined or reviewed by deflecting the electron beam and scanning it over the target surface. To minimize off-axis aberrations, dual-deflector scanning system may be used that includes a pre-scanner (Prescan) and a main-scanner (Mainscan). The image of the features of the target substrate may be formed by collecting the secondary electrons (SE) at a detector (DET). A Wien filter may be used to split the secondary electrons (SE) from the incident (primary) electrons.

Figure 5:
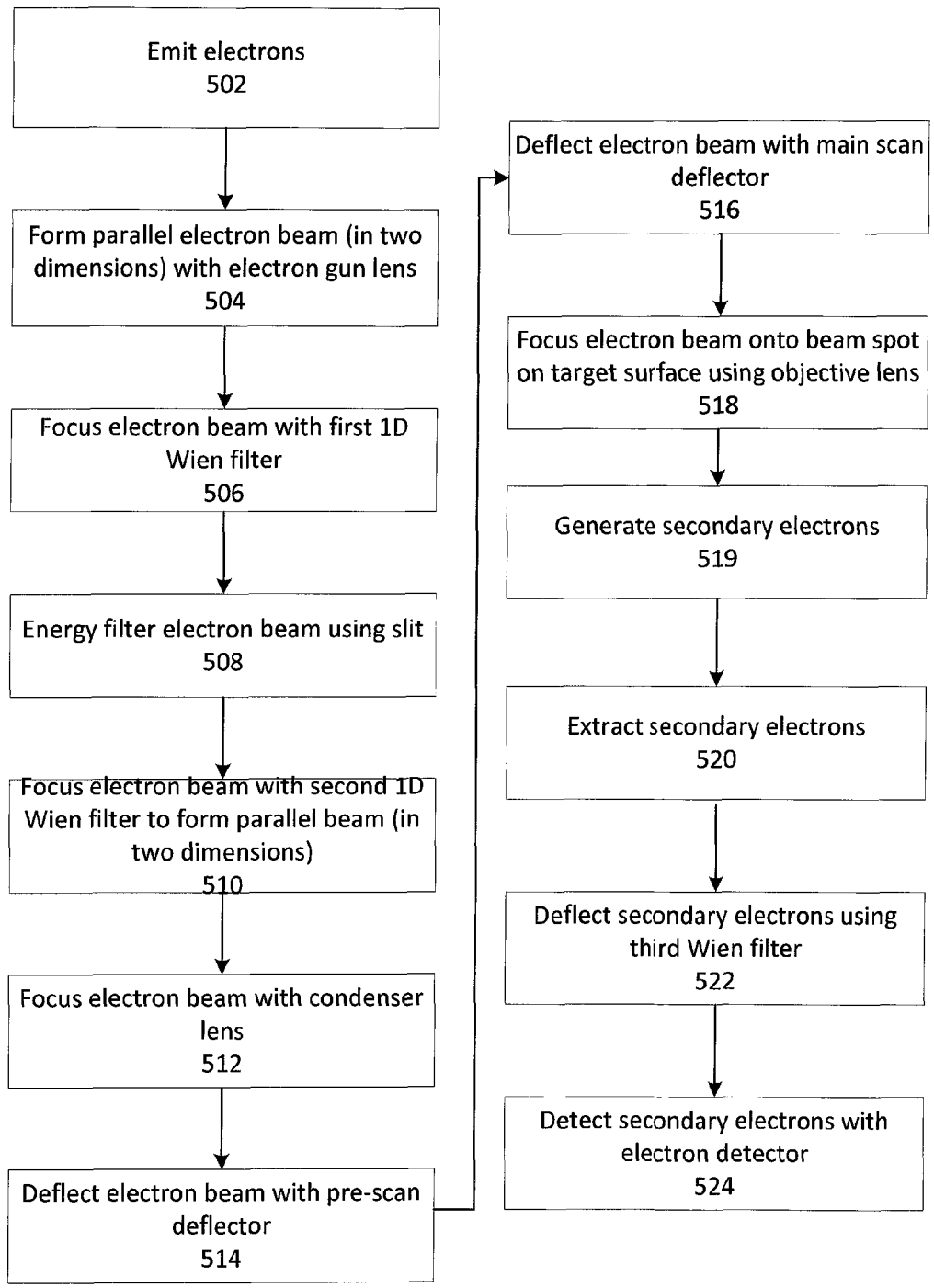
FIG. 5 is a flow chart of a method of forming and using an electron beam with a dual Wien-filter monochromator in an accordance with an embodiment of the invention.

FIG. 5 is a flow chart of a method 500 of forming and using an electron beam with a dual Wien-filter monochromator in an accordance with an embodiment of the invention. The method 500 may be performed using the apparatus described above in relation to FIGS. 1 and 3, for example.

Per step 502, electrons are emitted from an electron-emission source. The electron-emission source may be a tip of a thermal field emission (TFE) cathode emitter, for example. Other types of electron-emission sources may be used.

Per step 504, the electrons may be formed into a parallel electron beam with an electron gun lens. As described above, the parallel electron beam is parallel in two-dimensions. In particular, it is parallel in both x-o-z and y-o-z planes.

Per step 506, the electron beam may be focused using a first one-dimensional Wien filter (WF1). This one-dimensional focusing is described above in relation to WF1 in FIGS. 1 and 3, for example. As in FIGS. 1 and 3, the one-dimensional focusing of the beam may be in the x-o-z plane while the beam may remain parallel in the y-o-z plane.

Per step 508, energy filtering is applied to the electron beam using a slit. The slit is shaped like a line segment in that it has a width that is much smaller than its length. As described above, the cross-section of the electron beam as it reaches the plane of the slit is also like a line segment in that it has a width that is much smaller the length.

The energy filtering occurs because the amount of deflection by the Wien filter depends on the energy (velocity) of the electrons. The slit is positioned so as to allow electrons with energies in a range from $E_0-\Delta E$ to $E_0+\Delta E$ to pass through. Meanwhile, electrons with energies outside that range are blocked by the aperture material surrounding the slit.

Per step 510, the electron beam is focused by a second Wien filter (WF2) to form a parallel beam that exits the monochromator. The exiting beam is parallel in two dimensions (i.e. in both the x-o-z and y-o-z planes). In accordance with an embodiment of the invention, the first and second Wien filters may be completely symmetrical to the aperture both mechanically and electrically, such that the optical properties (focusing and deflecting capabilities) in each Wien filter may be identical (or nearly identical).

Per step 512, a condenser lens (CL) may focus the electron beam. As described above in relation to FIG. 4, the CL may focus the beam to a cross-over, and an image of the emitter tip is formed at the plane of the cross-over.

Per steps 514 and 516, a first controlled deflection may be applied by a pre-scan deflector, and a second controlled deflection may be applied by a main-scan deflector. Together, the pre-scan and main-scan deflections provide for dual-deflector scanning of the beam to reduce off-axis aberrations.

Per step 518, the electron beam may be focused onto a beam spot on a target surface. This step is generally accomplished using an objective lens (OL) such as described above in relation to FIG. 4.

Per step 519, secondary electrons generated due to the impingement of the incident beam at the target surface. The secondary electrons are extracted from the target surface (for example, by an extraction electrode and the objective lens) per step 520, and then deflected away from the incident beam using another (a third) Wien filter as a beam separator per step 522. Finally, the secondary electrons are detected using an electron detector (DET) per step 524.

Note that, using this method 500, the beam spot may be scanned over the surface of the target substrate. The secondary electron data detected in conjunction with the beam scanning may then be used to generate image data showing features of the target surface.

Figure 6:
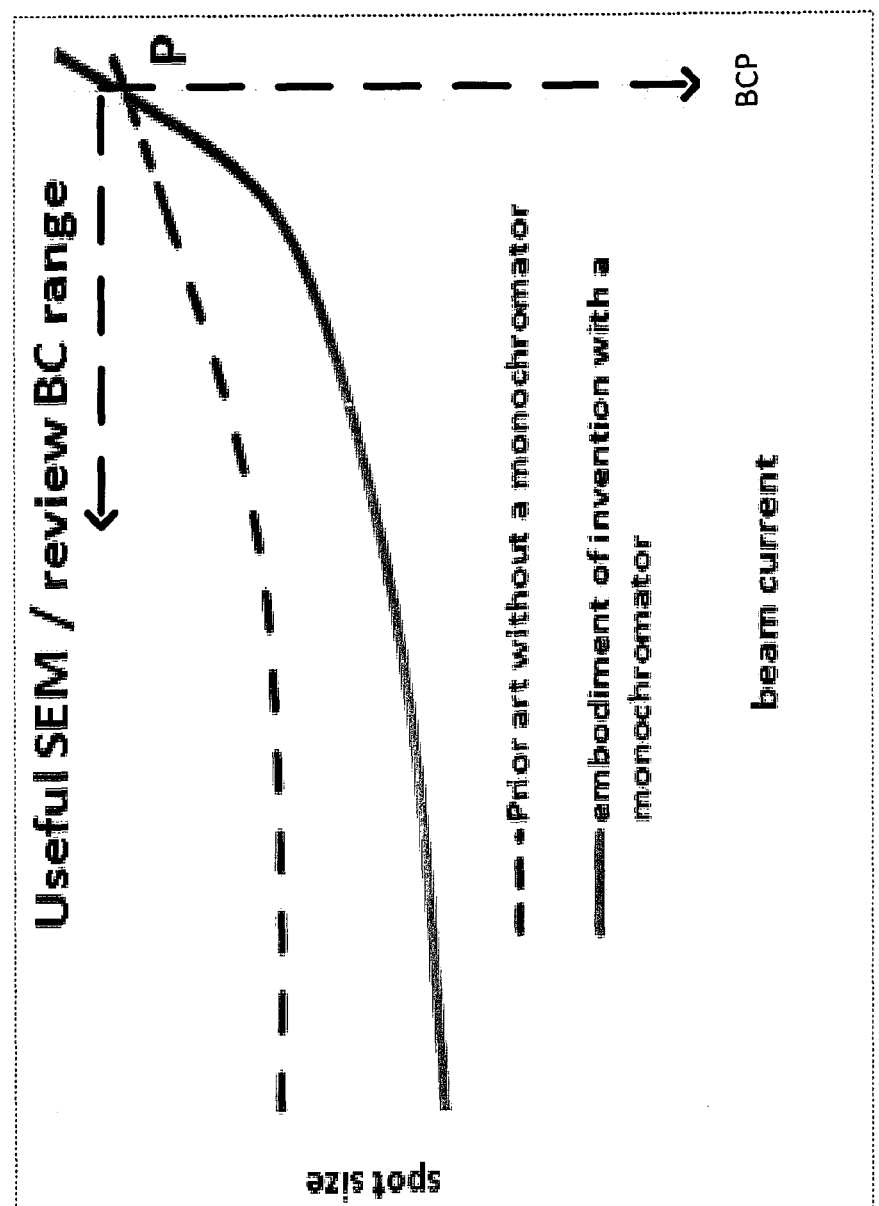
FIG. 6 is a graph of spot size versus beam current which shows the improved resolution at a same beam current that is achieved in an accordance with an embodiment of the invention.

FIG. 6 is a graph of spot size versus beam current which shows the improved resolution at a same beam current that is achieved in an accordance with an embodiment of the invention. The graph shows spot size versus beam current. As shown, up to a beam current BCP, the embodiment of the invention with a monochromator as taught herein has a smaller spot size for the same beam current. Thus, in accordance with an embodiment of the invention, an electron beam column with a monochromator as taught herein has an advantageously useful beam current range that is below BCP.

An electron beam apparatus using a dual Wien-filter monochromator such as disclosed herein (either floating or not) may be used in various applications. These applications include, but are not limited to, e-beam inspection, review and metrology on wafers, masks, templates, or light-emitting diodes.

Figure 7:
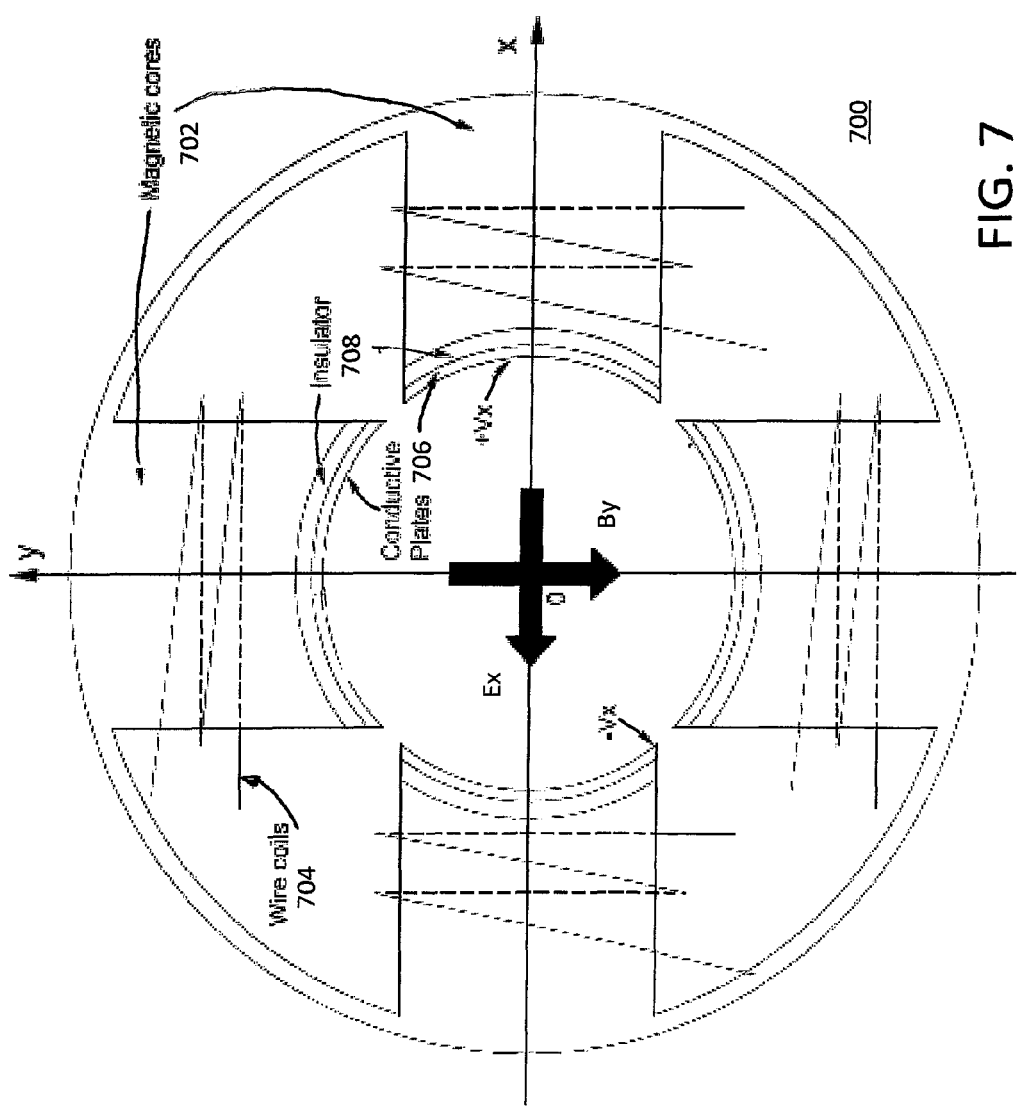
FIG. 7 is a cross-sectional diagram of a Wien filter that may be configured as a one-dimensional Wien filter in accordance with an embodiment of the invention.

FIG. 7 is a cross-sectional diagram of a Wien filter that may be configured as a one-dimensional Wien filter in accordance with an embodiment of the invention. An embodiment of the present invention configures the Wien filter shown in FIG. 7 as a 1D Wien filter. Other implementations of a 1D Wien filter may also be used.

The device 700 may include two pairs of magnetic cores (magnetic pole pieces) 702. A first pair of cores 702 may be aligned on the x-axis, and a second pair of cores 702 may be aligned on the y-axis, where the z-axis is the optical axis of the electron beam column. Conductive Wien coils 704 may be wound around each magnetic core 702. The magnetic fields along the x and y axes in the device 700 may be controllably adjusted by adjusting the electrical current flowing through the coils 704.

In addition, the device 700 may include two pairs of cylindrically-curved conductive plates 706. A first pair of cylindrically-curved plates 706 may be aligned on the x-axis, and a second pair of cylindrically-curved plates 706 may be aligned on the y-axis, where the z-axis is the optical axis of the electron beam column. As shown in FIG. 7, the plates 706 may be cylindrically curved and positioned so as to define an empty cylindrical space about the optical axis of the column.

To implement a 1D Wien filter, electrical current may be flowed through the coils around the second pair of cores 702 aligned on the y-axis, but not through the coils around the first pair of cores 702 aligned on the x-axis. This results in the generation of a magnetic field in the direction of the y-axis (i.e. By), but not in the direction of the x-axis (i.e.

Bx=0), for electrons traveling along the optical axis. In addition, voltages may be applied to the plates 706 so as to cause generation of an electrostatic field in the direction of the x-axis (i.e. Ex), but not in the direction of the y-axis (i.e. Ey=0), for electrons traveling along the optical axis.

As further shown in FIG. 7, insulators 708 may separate the plates 706 from the magnetic cores 702. The insulators 708 may have a curvature corresponding to the cylindrical-curvature of the plates 706. The surfaces of the magnetic cores 702 that abuts the insulators 708 may also have a cylindrical-curvature corresponding to the cylindrical-curvature of the plates 706.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An electron beam imaging apparatus comprising:
    an emitter-source tip that emits electrons;
    a gun electron lens that focuses the electrons to form an electron beam that is parallel in that the electron beam has electron trajectories that are parallel;
    a first Wien filter that focuses the electron beam in a first plane while leaving the electron beam to be parallel in a second plane;
    a slit opening of a slit aperture, wherein the slit opening has a width in the first plane and a length in the second plane, and wherein the width is narrower than the length; and
    a second Wien filter that focuses the electron beam to become parallel in the first plane while leaving the electron beam to be parallel in the second plane.

2. The apparatus of claim 1, wherein the first Wien filter focuses the electron beam to a first crossover in the first plane.

3. The apparatus of claim 2, wherein the first crossover in the first plane lies within the slit opening.

4. The apparatus of claim 3, wherein the slit opening allows electrons having an energy within an energy range to pass through while blocking electrons having an energy outside the energy range.

5. The apparatus of claim 1, wherein the slit opening is positioned so as to be equidistant from the first and second Wien filters, and wherein a focusing strength of the first and second Wien filters are equal.

6. The apparatus of claim 1, wherein a monochromator comprises the first Wien filter, the slit aperture, and the second Wien filter, and wherein the monochromator is electrically floating.

7. The apparatus of claim 6, wherein said electrically floating of the monochromator is accomplished by an outer conductive surrounding feature that is electrically grounded and an inner conductive surrounding feature to which a direct-current (DC) voltage is applied.

8. The apparatus of claim 1, further comprising:
    a condenser lens that focuses the electron beam to a second crossover; and
    an objective lens focuses the electron beam so as to form a beam spot on a surface of a target substrate.

9. The apparatus of claim 8, further comprising:
    a scanning system for deflecting the electron beam so as to scan the beam spot over an area of a target substrate being imaged.

10. The apparatus of claim 9, wherein the scanning system comprises:
    a pre-scan deflector that deflects the electron beam before the second crossover is formed; and
    a main scan deflector that deflects the electron beam before the electron beam reaches the objective lens.

11. The apparatus of claim 8, further comprising:
    a third Wien filter that deflects secondary electrons from the surface of the target substrate; and
    a detector that detects the secondary electrons to obtain image data.

12. A method of imaging using an electron beam, the method comprising:
    emitting electrons from an emitter source;
    focusing the electrons by a gun lens to form an electron beam that is parallel in that the electron beam has electron trajectories that are parallel;
    focusing the electron beam by a first one-dimensional Wien filter to a first crossover in a first plane while leaving the electron beam to be parallel in a second plane, wherein the first crossover coincides with a slit opening;
    passing electrons of the electron beam with energies within an energy range through the slit opening, while blocking electrons of the electron beam with energies outside the energy range; and
    focusing the electron beam by a second one-dimensional Wien filter to become parallel in the first plane while leaving the electron beam to be parallel in the second plane.

13. The method of claim 12, wherein the slit opening is positioned so as to be equidistant from the first and second Wien filters, and wherein a focusing strength of the first and second Wien filters are equal.

14. The method of claim 12, wherein the first one-dimensional Wien filter, the slit aperture, and the second one-dimensional Wien filter are electrically floating.

15. The method of claim 12, further comprising:
    deflecting the electron beam by a pre-scan deflector;
    focusing the electron beam to a second crossover;
    deflecting the electron beam by a main scan deflector; and
    focusing the electron beam so as to form a beam spot on a surface of a target substrate.

16. The method of claim 15, further comprising:
    extracting secondary electrons from the surface of the target substrate;
    deflecting the secondary electrons away from the electron beam; and
    detecting the secondary electrons to obtain image data.

17. A dual Wien-filter monochromator comprising:
- a first Wien filter that focuses an electron beam in a first plane while leaving the electron beam to be parallel in a second plane;
- a slit opening of a slit aperture, wherein the slit opening allows electrons of the electron beam having an energy within an energy range to pass through while blocking electrons of the electron beam having an energy outside the energy range; and
- a second Wien filter that focuses the electron beam to become parallel in the first plane while leaving the electron beam to be parallel in the second plane.

18. The monochromator of claim 17, wherein the first Wien filter focuses the electron beam to a first crossover in the first plane.

19. The monochromator of claim 18, wherein the first crossover in the first plane lies within the slit opening.

20. The monochromator of claim 17, wherein the slit opening is positioned so as to be equidistant from the first and second Wien filters, and wherein a focusing strength of the first and second Wien filters are equal.

21. The monochromator of claim 17, wherein the monochromator is electrically floating.

22. The monochromator of claim 21, wherein said electrically floating of the monochromator is accomplished by an outer conductive surrounding feature that is electrically grounded and an inner conductive surrounding feature to which a direct-current (DC) voltage is applied.

* * * * *